United States Patent

Face, Jr. et al.

[11] Patent Number: 6,030,480
[45] Date of Patent: Feb. 29, 2000

[54] METHOD FOR MANUFACTURING MULTI-LAYERED HIGH-DEFORMATION PIEZOELECTRIC ACTUATORS AND SENSORS

[75] Inventors: Samuel A. Face, Jr.; Stephen E. Clark, both of Norfolk, Va.

[73] Assignee: Face International Corp., Norfolk, Va.

[21] Appl. No.: 09/119,883

[22] Filed: Jul. 21, 1998

Related U.S. Application Data

[60] Provisional application No. 60/053,702, Jul. 25, 1997.

[51] Int. Cl.[7] .......................... B32B 31/04; B32B 31/20; H01L 41/22
[52] U.S. Cl. .................. 156/160; 156/311; 29/25.35; 29/446
[58] Field of Search ................... 29/25.35, 446; 156/160, 242, 245, 311

[56] References Cited

U.S. PATENT DOCUMENTS

| | | |
|---|---|---|
| 3,532,570 | 10/1970 | Cotter . |
| 3,960,635 | 6/1976 | La Roy et al. ......................... 156/286 |
| 5,632,841 | 5/1997 | Helbaum et al. ...................... 29/25.35 |
| 5,891,291 | 4/1999 | Okamoto et al. ..................... 156/273.9 |

Primary Examiner—Sam Chaun Yao

[57] ABSTRACT

A method and apparatus for manufacturing prestressed piezoelectric actuators which maximizes output, and increases the precision and efficiency with which the multi-layer actuators are made. Individual layers of the piezoelectric actuators are automatically stacked and registered with respect to each other within press members prior to bonding the layers to each other with a thermoplastic adhesive. Compressive force is applied while heat is conductively transferred from a heating element to the actuator in order to raise the temperature of each of the layers above the melting point of the thermoplastic. The temperature of the heating element is then decreased until the temperature of the actuator layers drops to below the melting point of the thermoplastic adhesive, thereby bonding the layers. Compressive force is then released, and the actuators are removed, further cooled and polarized. The temperature of the actuator may be sensed, and the pressure and the heat applied to the actuator varied in accordance with the sensed temperature.

8 Claims, 15 Drawing Sheets

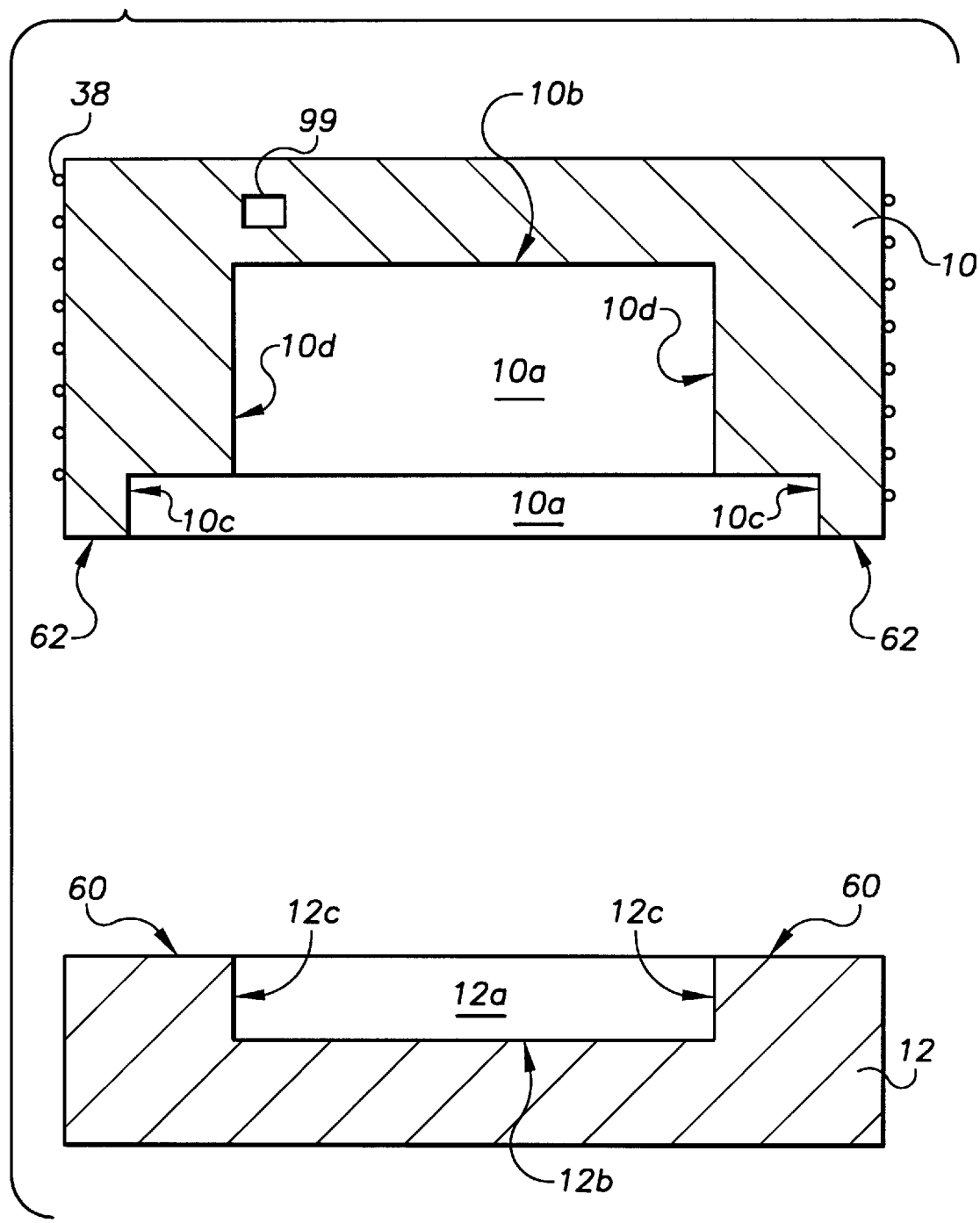

METHOD FOR MANUFACTURING MULTI-LAYERED HIGH-DEFORMATION PIEZOELECTRIC ACTUATORS AND SENSORS

This Appln claims the benefit of U.S. Provisional No. 60/053,702 filed Jul. 25, 1997.

BACKGROUND OF THE INVENTION

1. Field of the Invention

The present invention relates to a method and apparatus for manufacturing piezoelectric devices. More particularly, the present invention is directed to an automated, high-volume method and apparatus for manufacturing multi-layered high deformation piezoelectric actuators and sensors.

2. Description of the Prior Art

The present invention is a unique method and apparatus for automatically manufacturing piezoelectric actuators and sensors, principally pre-stressed high deformation actuators and sensors. The disclosed invention provides a method of manufacturing high deformation actuators which is fast, reliable, precise and easy as compared with prior manufacturing methods.

Piezoelectric materials change shape when a voltage potential is applied across their faces. Piezoelectric materials used in conventional configurations have limited application because of the relatively small amount of displacement which the piezoelectric material undergoes during electrical excitation. In order to increase the amount of displacement which can be developed by the piezoelectric material (typically a thin ceramic wafer) the material may be "pre-stressed". Prior methods of pre-stressing the ceramic wafer include bonding a metallic foil (for example aluminum, stainless steel or the like), under tension, to the ceramic with an adhesive (such as LaRC-SI™ or the like), thus creating what is known as THUNDER (THin layer composite UNimorph ferroelectric Driver and sEnsoR) as disclosed in U.S. Pat. No. 5,632,841. Other methods, such as the "Rainbow" method as disclosed in U.S. Pat. No. 5,471,721, use a chemical reduction process to pre-stress the ceramic wafer. The present invention provides a method and apparatus for producing pre-stressed piezoelectric actuators such as THUNDER and the like. The following disclosure principally describes the preferred embodiment of the invention and its use in manufacturing THUNDER. It will be understood, however, that the present invention, or modifications thereof, may be used to manufacture other types of multi-layer piezoelectric actuators and sensors.

Prior methods of manufacturing THUNDER include inefficient, low output methods which rely heavily on human labor. The prior method of manufacturing THUNDER actuators is as follows: THUNDER actuators are commonly constructed in a "sandwich" configuration with each actuator having a plurality of layers, including first and second metal pre-stress layers, first and second adhesive layers, and a PZT ceramic wafer with electrodes disposed on both major faces. Initially, all of the layers are manually cut to their desired shape. A razor blade or similar instrument is used to cut the ceramic wafer; and a paper cutter, scissors or a razor blade is typically used to cut the adhesive and metal pre-stress layers to size.

Before the "sandwich" can be constructed the two major faces of the ceramic wafer, one major surface of the first metal pre-stress layer and one major surface of the second metal pre-stress layer are sprayed with a primer coating of LaRC-SI™ using an air brush or the like. LaRC-SI™ is a soluble imide developed by the National Aeronautics and Space Administration which is manufactured by NASA in accordance with the process disclosed in U.S. Pat. No. 5,639,850. Initially, one side of the ceramic wafer is sprayed with LaRC-SI™. The coated ceramic wafers are placed on a release cloth-covered aluminum tray. The aluminum tray, release cloth and ceramic wafers are placed in an oven at approximately 70 deg. C., where they remain until the LaRC-SI™ dries. The tray and its contents are subsequently removed from the oven, and the LaRC-SI™ coating process is repeated a second time for the same side of the ceramic wafer. After the second coat is dry, the ceramic wafers are turned over and two coats of LaRC-SI™ adhesive are applied to the opposing major surface using the above described process. The same process is then repeated for the first and second metal pre-stress layers, however only one major surface of the metal pre-stress layers is coated. Because LaRC-SI™ is a dielectric, and in a finished THUNDER actuator the adhesive layer is disposed between a metal pre-stress layer and the ceramic wafer, it is sometimes necessary to roughen a major surface of the metal prestress layers using sandpaper so that intermittent electrical contact is made between the metal prestress layers and the electrodes.

After the LaRC-SI™ coating on the ceramic wafers and the first and second metal pre-stress layers are dry, the "sandwich" is ready for assembly. The first metal pre-stress layer, which is usually the bottom layer in the "sandwich", typically comprises steel, stainless steel, beryllium alloy or other metal. Placed adjacent the first pre-stress layer in the "sandwich" is the first adhesive layer which is typically LaRC-SI™ material in a thin film form. The PZT piezoelectric ceramic wafer which is electroplated on its two opposing faces is placed on top of the first adhesive layer. A second adhesive layer, also comprising LaRC-SI™ material or the like, is positioned on top of the ceramic wafer, and a second metal pre-stress layer, which typically comprises aluminum foil or the like, is placed on top of the second adhesive layer thereby completing the "sandwich". As the layers are stacked in the desirable configuration a "dot" of glue is placed between each adjacent layer to prevent slippage of adjacent layers of the "sandwich" during the manufacturing process. Prior THUNDER actuators have been constructed using various numbers of adhesive layers and/or metal pre-stress layers, depending on the desired pre-stressing characteristics.

The "sandwich" building process is repeated until a desirable number of composite structures have been assembled. Each assembled composite structure is placed on a heating tray. The heating tray comprises an aluminum plate, a first layer of fiberglass, and a first layer of release cloth. The first layer of fiberglass is positioned on top of the aluminum plate, and the first layer of release cloth is placed on top of the first layer of fiberglass. The composite structures are positioned on the heating tray, and a second layer of release cloth is placed on the composite structures. A second layer of fiberglass is placed on the second layer of release cloth. A heat resistant sealant tape is disposed around the perimeter of the heating tray to hold the first and second layers of release cloth, the first and second layers of fiberglass and the composite structures in place. A sheet of Kaptan™ is placed over the secured heating tray, and the entire assembly is placed in an autoclave. A vacuum line is inserted under the Kaptan™ sheet; and the Kaptan™ sheet pulls the composite structures against the heating tray as a vacuum is drawn through the vacuum line.

While in the autoclave, the ceramic wafer, the first and second adhesive layers and the first and second pre-stress layers are simultaneously heated to a temperature above the melting point of the adhesive material (typically several hundred degrees Fahrenheit). Due to the relatively large mass of the autoclave, it may take several hours to heat the entire inner chamber to a sufficient temperature. The temperature is then maintained above the LaRC-SI™ melting point for approximately an hour. Natural convection currents, set up within the chamber, transfer heat to the individual composite structures. In some situations, if natural convection is not sufficient, forced convection, using fans or pumps are used. After sufficient heating, the autoclave and the composite structures are allowed to cool, thereby re-solidifying and setting the adhesive layers. The cooling process typically takes several hours due to the high temperature within the autoclave. During the cooling process the ceramic wafer becomes compressively stressed, due to the higher coefficient of thermal contraction of the materials of the pre-stress layers than for the material of the ceramic wafer. Also, due to the greater thermal contraction of the laminate materials (e.g. the first pre-stress layer and the first adhesive layer) on one side of the ceramic wafer relative to the thermal contraction of the laminate materials (e.g. the second adhesive layer and the second pre-stress layer) on the other side of the ceramic wafer, the ceramic wafer deforms in an arcuate shape having a normally concave face and a normally convex face.

A strong bond between adjacent layers of a finished THUNDER actuator is critical. This bond is accomplished in the prior art by drawing the Kaptan™ sheet down onto the composite structures during the heating process using the vacuum line. Nitrogen is injected into the autoclave during the heating process to pressurize the autoclave. The pressure placed on the composite structures by the sheet of Kaptan™ and the pressurized nitrogen atmosphere, while the LaRC-SI™ is in a liquid state, aids in pressing the composite structures together and producing a substantial bond between adjacent layers.

Subsequent to cooling the autoclave sufficiently, the heating tray and its contents are removed from the autoclave, and each THUNDER element is then removed from the tray by hand. Each THUNDER element is then electrically "poled" at a poling station by applying a relatively high voltage potential between the opposing major faces of the THUNDER element. The poling process takes approximately two minutes for each individual THUNDER element.

The above described THUNDER manufacturing process is time consuming, inefficient, and of relatively low quality as compared to what could be achieved by automated systems. In prior THUNDER manufacturing processes tight tolerances cannot be achieved, and quality control is at a minimum. Manual cutting of each layer of the THUNDER device takes a great deal of time and is not as accurate as can be accomplished by machine.

Another problem inherent with this prior method of THUNDER production relates to the use of an autoclave to pressurize and heat the ceramic, adhesive, and metallic materials. An autoclave is not energy efficient because large quantities of heat are required to raise the temperature of the mass of the autoclave to desirable levels. The heating process is time consuming because in order to raise the temperature of a single "sandwich" the entire autoclave chamber must be heated, and the heat must be transferred from the autoclave chamber atmosphere to the Kapton™ by convection, and then the heat must be transferred by conduction through the Kapton™ (an insulator) to the "sandwich". A comparable amount of time is required to allow the autoclave to cool to a safe temperature before removing the THUNDER devices from the autoclave.

In addition, because of the tendency of the cooling "sandwich" to deform into an arcuate shape (due to the differences in coefficients of thermal expansion of the layers of the "sandwich"), it is necessary to release pressure on the "sandwich" in a controlled manner during the cooling process. It is desirable that the releasing of pressure on the "sandwich" be controlled in accordance with temperature of the "sandwich" as it cools down. However, because of the use of an autoclave to convectively heat (and subsequently cool down) the "sandwich" it is very difficult to determine the exact temperature of the "sandwich" at any given time, unless the autoclave atmosphere is heated up (and cooled down) very slowly.

Furthermore, due to temperature variations from one location to another within the autoclave, the temperature of one "sandwich" may be different from that of another inside of the autoclave. However, because the pressure on all of the "sandwiches" in the autoclave is the same (i.e. corresponding to the chamber atmosphere's pressure), it is not possible to release the pressure on individual THUNDER "sandwiches" at different times in accordance with the respective temperatures of each "sandwich".

Accordingly, it would be desirable to provide a method and apparatus for high volume, high precision, high speed manufacturing of piezoelectric actuators which limits human involvement and maximizes efficiency.

SUMMARY OF THE INVENTION

In view of the foregoing disadvantages inherent in the known methods and devices for manufacturing pre-stressed piezoelectric actuators now present in the prior art, the present invention provides a method and apparatus for manufacturing pre-stressed piezoelectric actuators which maximizes output, and increases the precision and efficiency with which the actuators are made relative to the prior art.

Accordingly, it is a primary object of the present invention to provide a method of the character described for manufacturing piezoelectric actuators which improves upon the prior art.

It is another object of the present invention to provide a manufacturing system which is automated.

It is an object of the present invention to provide a method of manufacturing multi-layer piezoelectric actuators.

It is another object of the present invention to provide a method of the character described in which individual layers of the piezoelectric actuators are automatically stacked and registered with respect to each other prior to bonding the layers to each other.

It is another object of the present invention to provide a method of the character described in which adjacent layers of the actuators are bonded to each other with a thermoplastic adhesive.

It is another object of the present invention to provide a method of the character described in which heat is conductively transferred from a heating element to each of the layers of the actuator in order to raise the temperature of each of the layers above the melting point of the thermoplastic.

It is another object of the present invention to provide a method of the character described in which the compressive force applied to the actuator by the heating element is sustained until the temperature of the actuator layers drops to below the melting point of the thermoplastic adhesive.

It is another object of the present invention to provide a method of the character described in which the compressive force applied by the heating element to the actuator is sustained until the temperature of the actuator layers drops to below the melting point of the thermoplastic adhesive.

It is another object to provide a modification of the present invention in which the temperature of the actuator is sensed, and the pressure applied by the heating element to the actuator is varied in accordance with the sensed temperature.

It is another object of the present invention to provide a method of the character described in which a plurality of actuators can be simultaneously produced, and in which the temperature of, and/or pressure applied to, individual actuators may be separately controlled.

It is another object of the present invention to provide a manufacturing process of the character described which is capable of producing actuators at a high rate.

It is another object of the present invention to provide a manufacturing process of the character described which obviates the use of a conventional autoclave.

It is another object of the present invention to provide a manufacturing process of the character described which produces actuators which are pre-stressed.

It is another object of the present invention to provide a manufacturing process of the character described which is capable of producing high deformation arcuate actuators.

It is yet another object of the present invention to provide a manufacturing process of the character described which is highly efficient as contrasted with the prior art.

Further objects and advantages of this invention will become apparent from a consideration of the drawings and ensuing description thereof.

DESCRIPTION OF THE PREFERRED EMBODIMENTS

Figure 1:
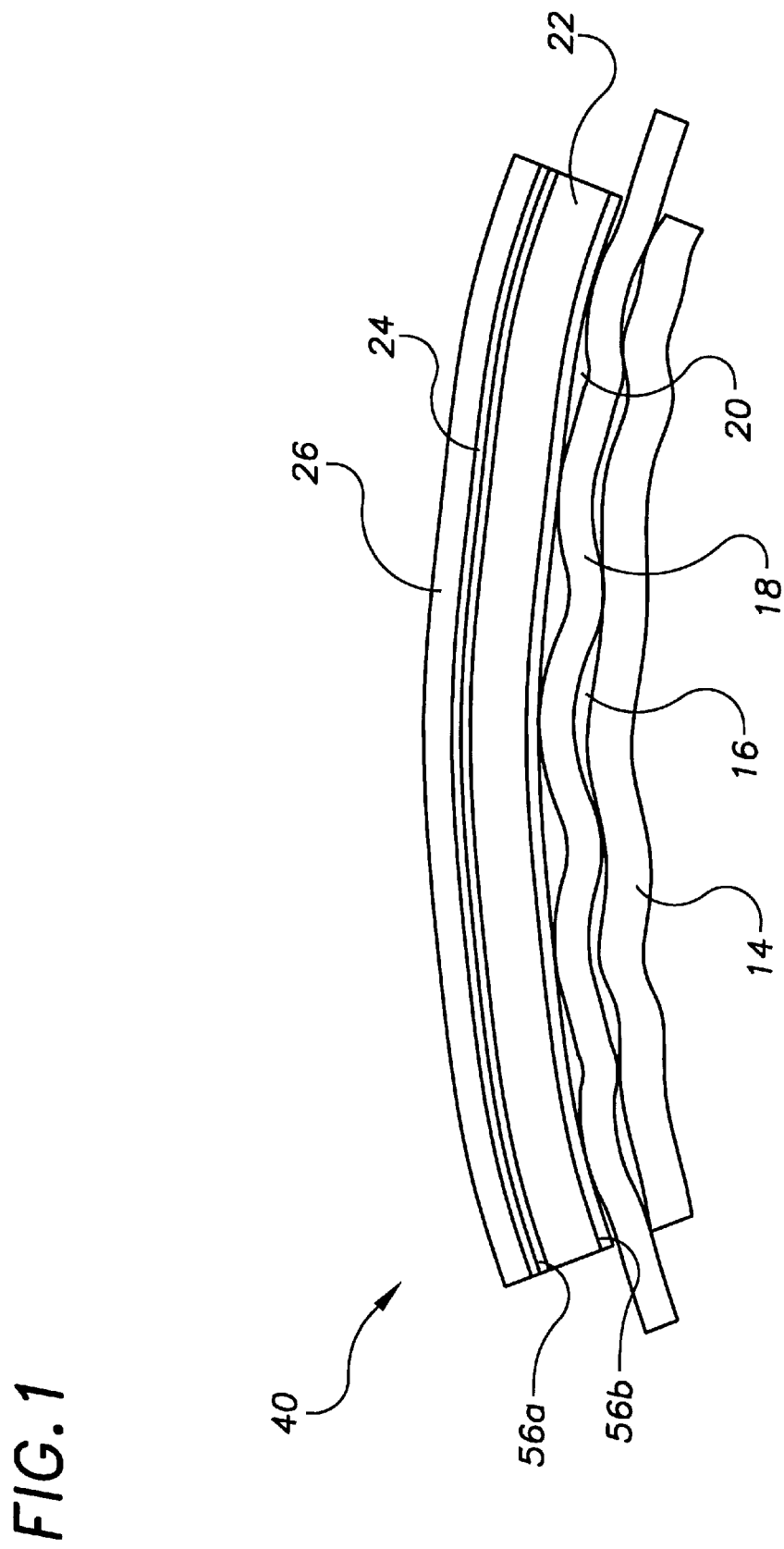
FIG. 1 is a side elevation of a high deformation piezoelectric actuator made in accordance with the present invention.

With reference directed toward the appended drawings, a pre-stressed high deformation piezoelectric actuator (generally designated by the reference numeral 40) manufactured embodying the principles and concepts of the present invention will be described.

As will be described more fully herein below, a high deformation actuator 40 is manufactured, in part, by sequentially "stacking" (step 101) various component layers of the actuator upon each other and then subjecting the "stack", as a whole, to various operations. As used herein, the reference indicia 32, 32a, 32b and 32c refer to the "stack" of component layers of the high deformation actuator 40 during corresponding stages of stacking (i.e. step 101) of the manufacturing process.

Figure 2:
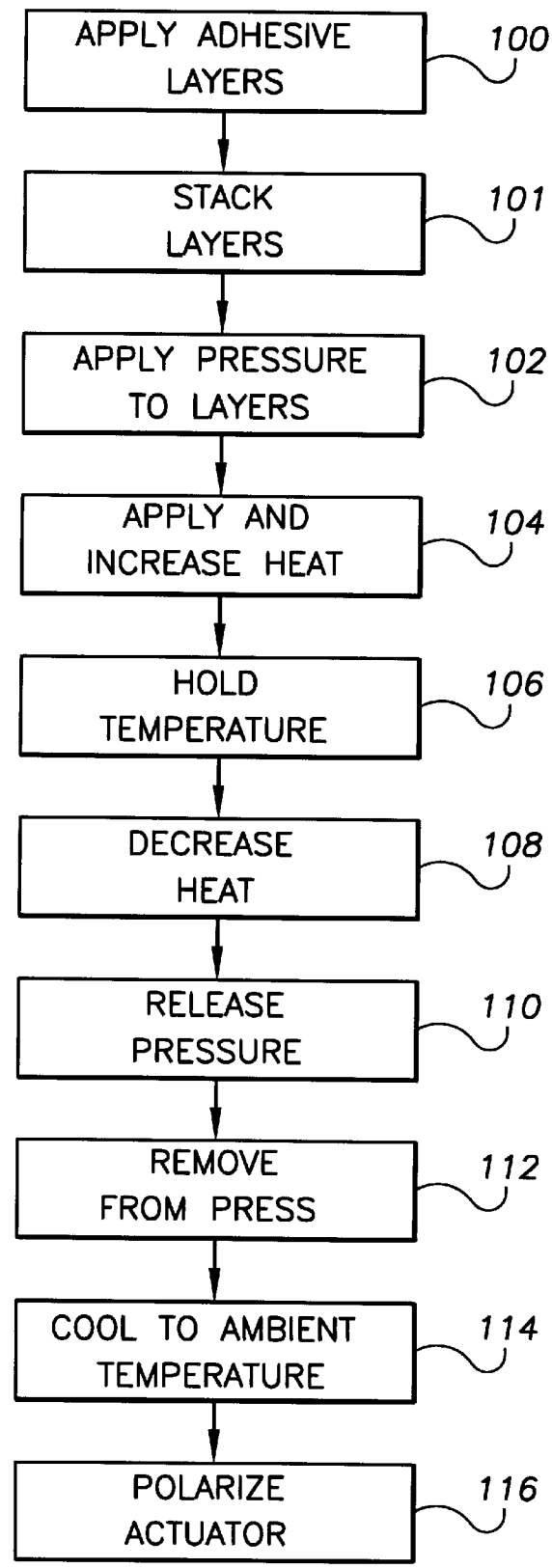
FIG. 2 is a schematic flow diagram showing a method of manufacturing piezoelectric actuators in accordance with the preferred embodiment of the present invention.

Referring now to FIGS. 1 and 2: FIG. 2 is a flow diagram showing the steps in the preferred embodiment of the present invention, with individual steps denoted by three-digit reference indicia. The first step in the preferred embodiment of the present invention is to apply 100 the adhesive layers 16, 20 and 24 to the respective major surfaces of the ceramic layer 22 and the first metal prestress layer 14. The adhesive layers 16, 20 and 24, which may initially be either in the form of a spray, a liquid, or a thin deformable sheet, are brushed, sprayed or disposed by another conventional method to a major surface of the first metal prestress layer 14 and both major surfaces of the ceramic layer 22 as indicated in FIG. 1.

Next, the layers of the actuator stack (32) are stacked 101 between a first press member 12 and a second press member 10. FIGS. 3b–8 show the actuator stack (32a, 32b, 32c and 32) during sequential stages of the stacking step 101.

In the following disclosure the relative orientations of the press members 10 and 12 and the various layers of the actuator stack 32 are described consistently with their respective orientations illustrated in the accompanying drawing figures; thus the second press member 10 is referred to as being located "above" the actuator stack 32, the first press member 12 is referred to as being located "under" the actuator stack 32, and the lengths of the component layers of the actuator stack 32 are indicated as being nominally horizontally oriented. However, it is within the scope of the present invention to orient the press members 10 and 12 and the actuator stack 32 in any number of various other positions with respect to horizontal.

Figure 3B:
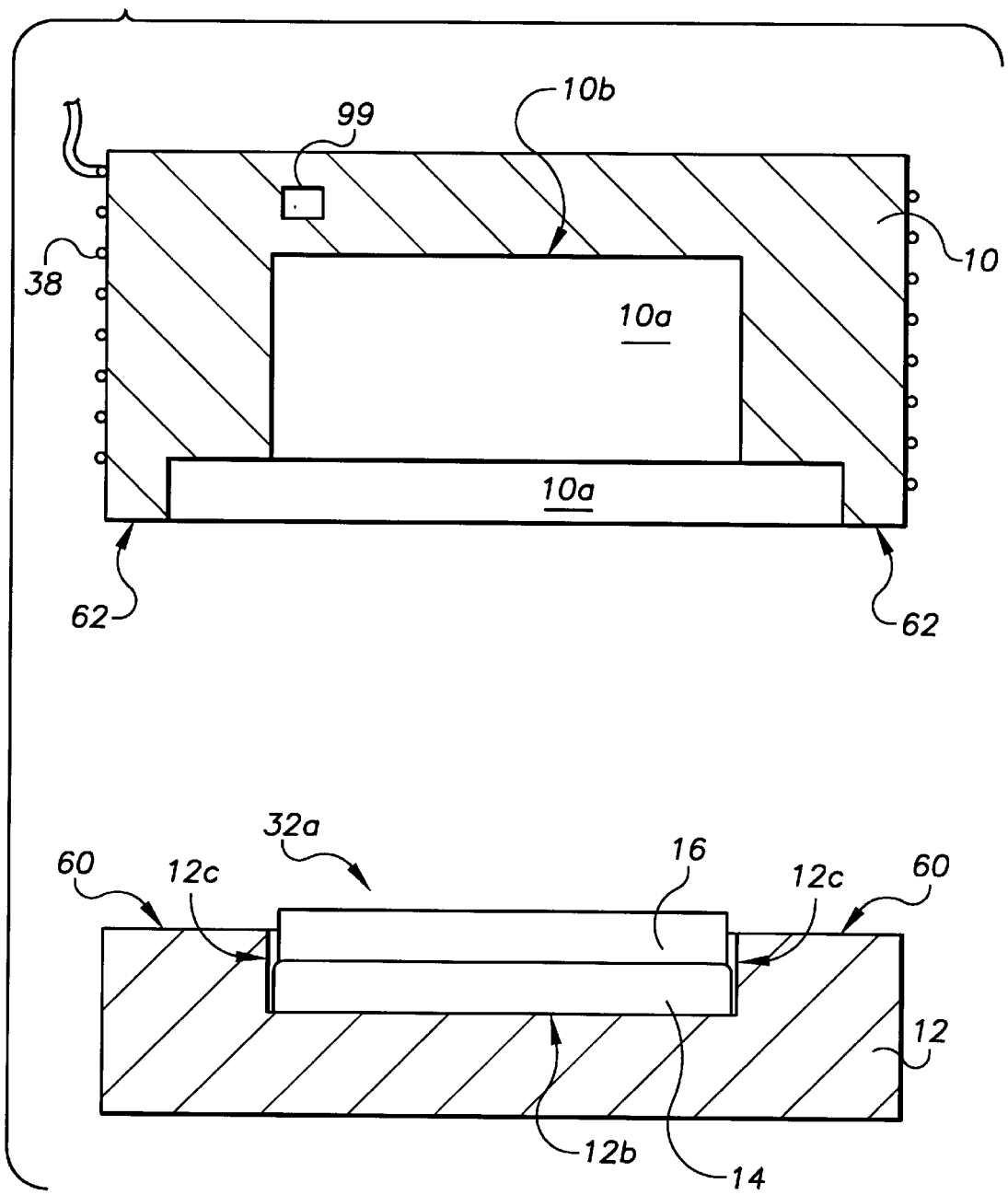
FIGS. 3a–9 are cross-sectional elevations showing press members in sequential stages of operation during the manufacture of piezoelectric actuators in accordance with the present invention.

As shown in FIG. 3b, a first metal prestress layer 14, preferably made of stainless steel has a first adhesive layer 16, preferably made of LaRC-SI™ or similar polyimide, bonded to one of its two major surfaces. The first metal prestress layer 14 and the first adhesive layer 16 are placed into an inner recess 12a in the face 60 of the first press member 12.

Figure 4:
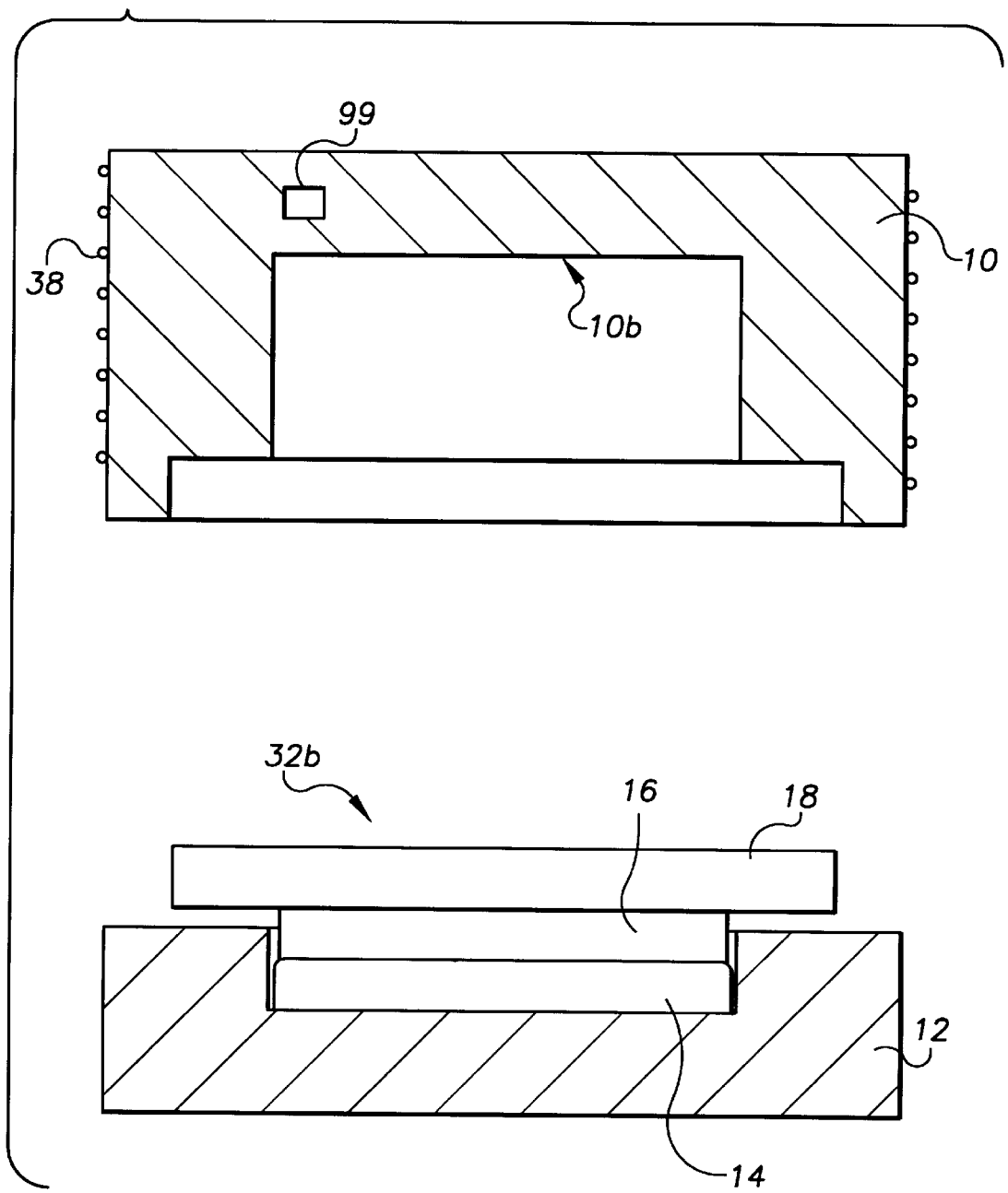

As shown in FIG. 4, a second metal prestress layer 18, preferably made of aluminum, is placed on top of the first adhesive layer 16.

Figure 5:
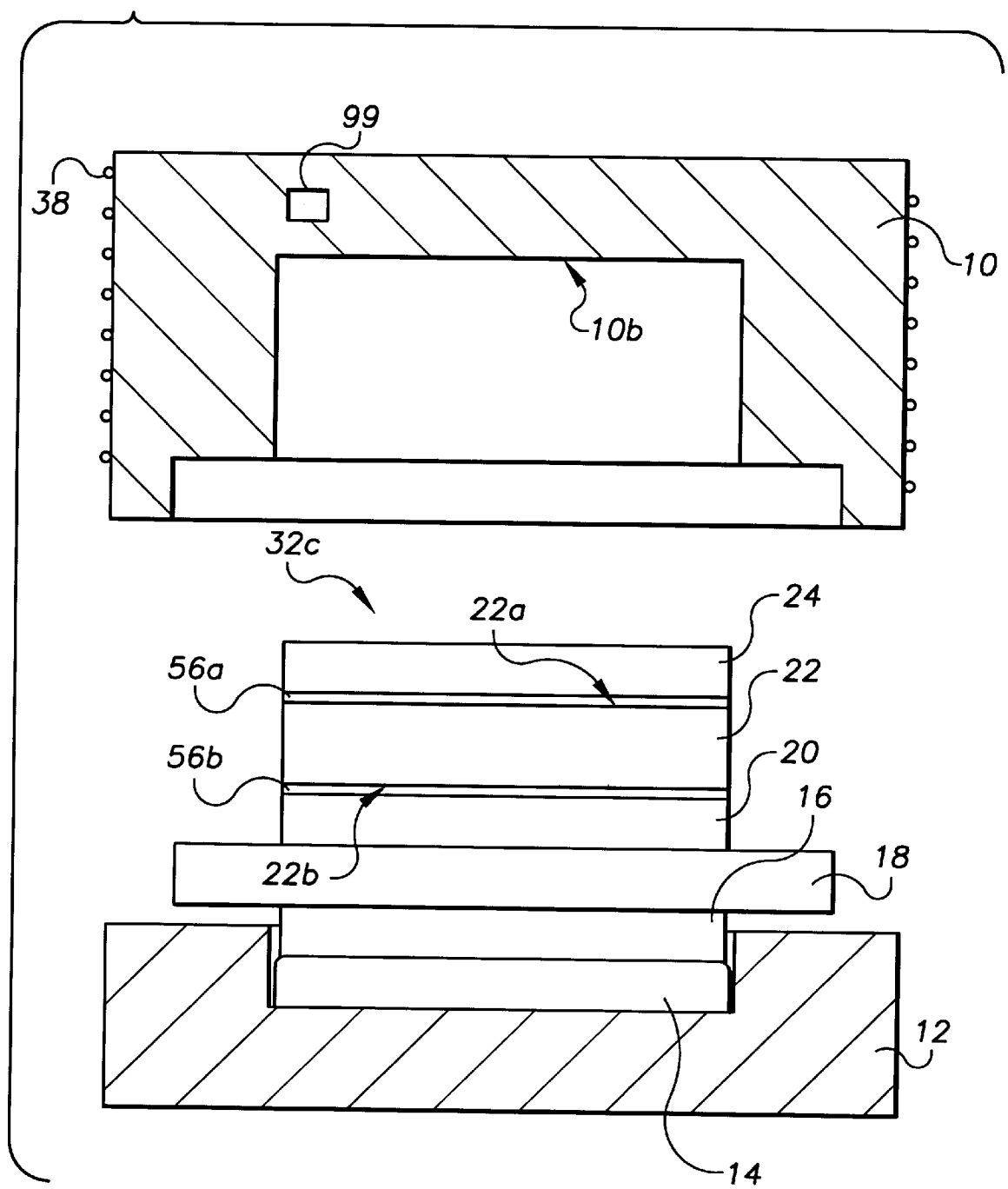

Next, as shown in FIG. 5, the ceramic layer 22, preferably made of a piezoelectric material, with second and third adhesive layers 20 and 24, preferably made of LaRC-SI™ or similar polyimide, bonded to each of its major surfaces 22a and 22b, is placed on top of the second metal prestress layer 18.

Figure 6:
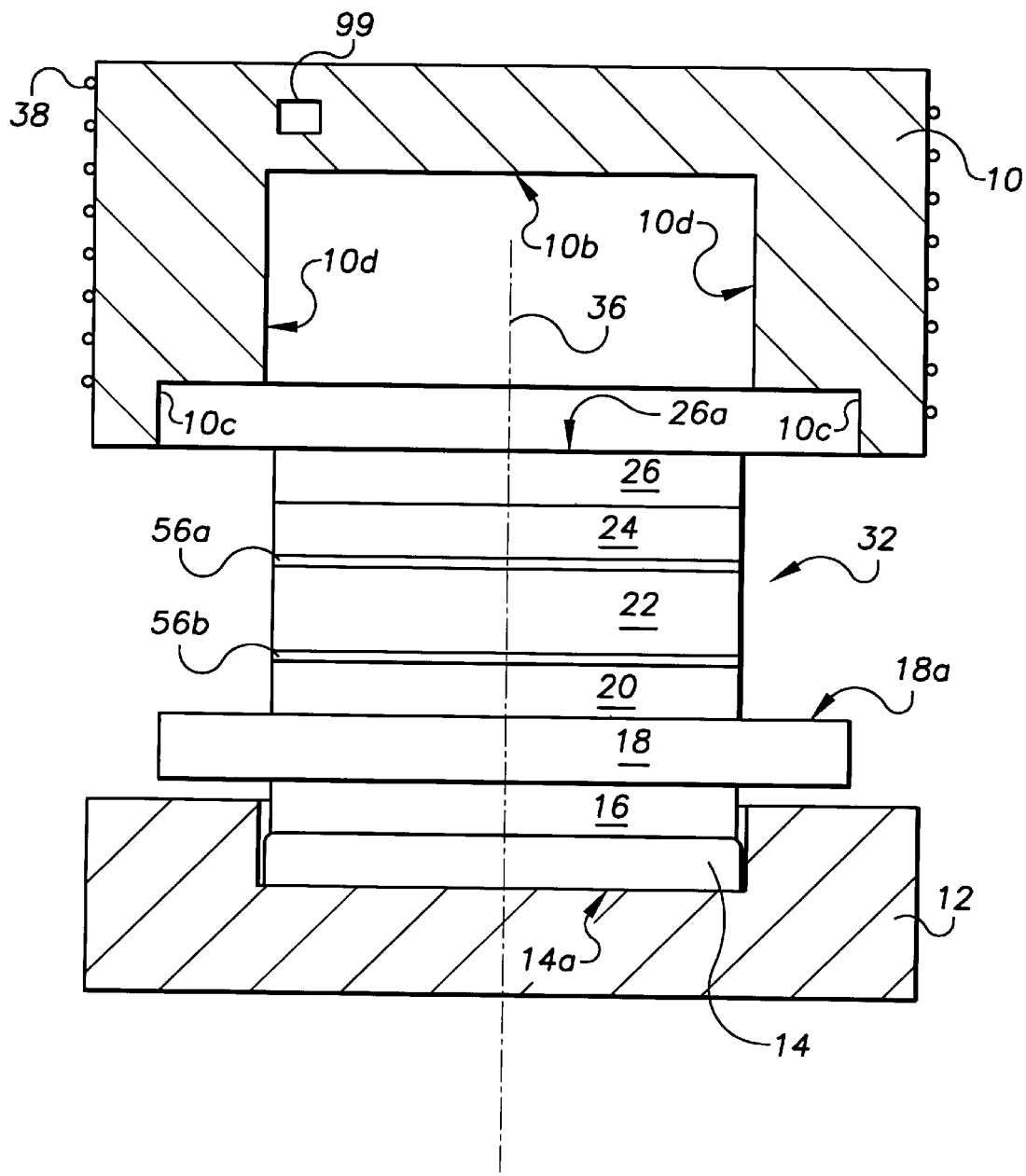

Next, as shown in FIG. 6, a third metal prestress layer 26 is placed on top of the third adhesive layer 24. In the preferred embodiment of the invention, the sides of the various laminate layers 26, 24, 33, 20, 16, 14, (except for the second metal prestress layer 18), are substantially aligned with one another. The second metal prestress layer 18 is preferably of larger diameter than the other layers (26, 24, 33, 20, 16, 14), so that a portion 18a of it extends beyond the sides of the other laminate layers (26, 24, 33, 20, 16, 14) to facilitate the application of electrical contacts (not shown) to the metal prestress layer 18 at a later time.

In the preferred embodiment of the present invention, the layers 14, 16, 18, 20, 22, 24 and 26 of the actuator stack 32 have a substantially circular shape as viewed perpendicular to their major surfaces. However, it is within the scope of the present invention to employ rectangular (or other) shaped layers 16, 18, 20, 22, 24 and 26.

In the preferred embodiment of the present invention, the ceramic layer 22 is electroplated 56a and 56b on each of its major faces 22a and 22b prior to the application of the second and third adhesive layers 20 and 24. In modifications of the present invention other ferroelectric materials, including piezostrictive materials, may be used to form the ceramic layer 22.

Figure 7:
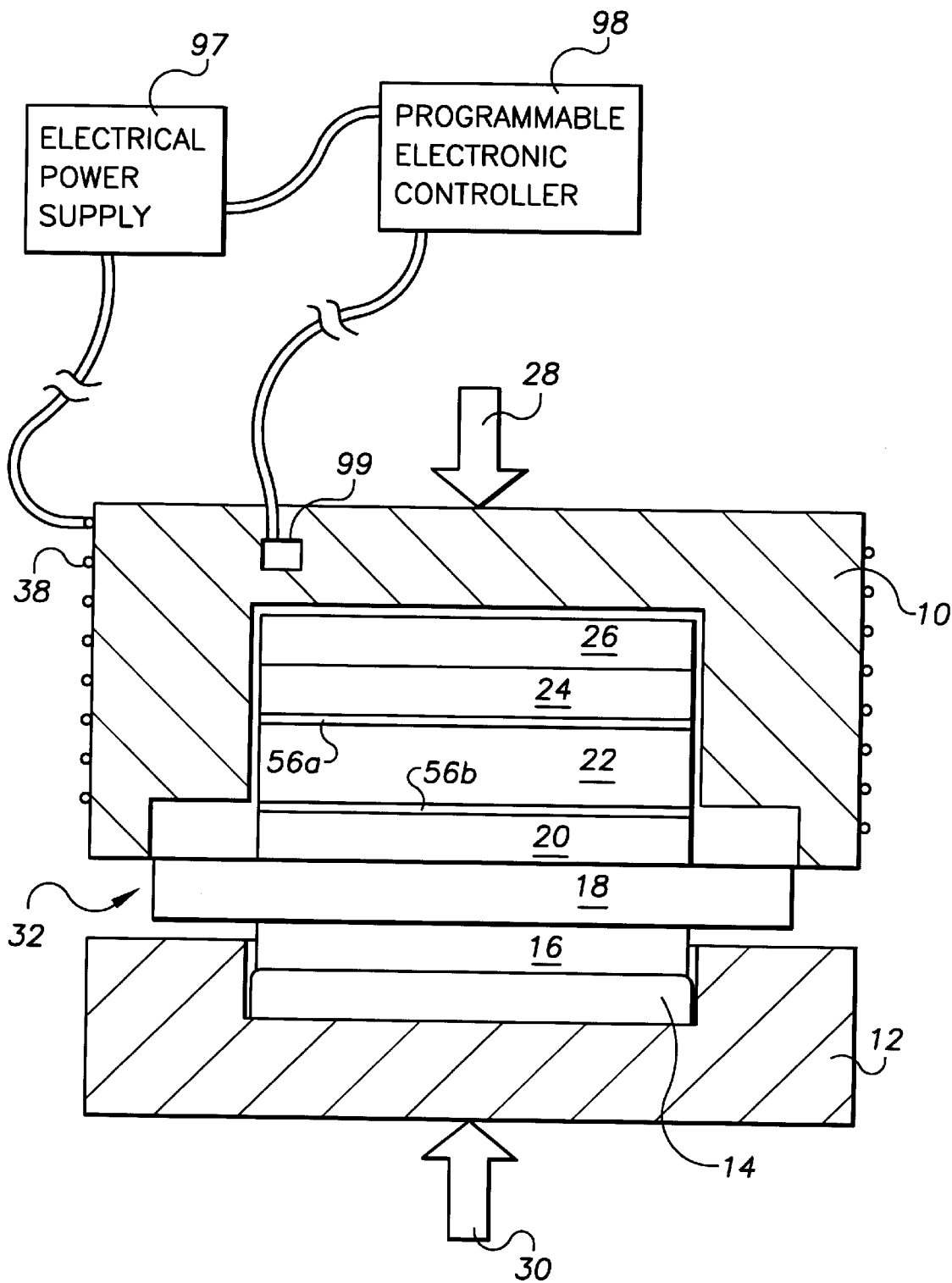

Referring now to FIGS. 2 and 7, after stacking 101 the layers 14, 16, 18, 20, 22, 24 and 26 of the actuator stack 32, the first and second press members 10 and 12 are drawn toward each other, as indicated by arrows 28 and 30. As the first and second press members 10 and 12 are drawn together, the recess 10a in the face 62 of the second press member 10 receives the laminate layers (26, 24, 33, 20 and 18). By drawing the first and second press members 10 and 12 together, external pressure is applied 102 to the actuator stack 32 by the first and second press members 10 and 12 in a direction substantially perpendicular to the major surfaces of the actuator stack 32 layers. The press members 12 and 10 may be actuated by pneumatic means, hydraulic means or other means commonly used for creating pressure.

As shown in FIGS. 6 and 7, the second press member 10 is advantageously configured with a recess 10a in its face 62 such that when the second press member 10 is drawn downward against the actuator stack 32 the sides of the ceramic layer 22, the third metal prestress layer 26 and the second and third adhesive layers 20 and 24 are held substantially aligned with one another by the upper wall 10d of the recess 10a in the second press member 10, and the sides of the second metal prestress layer 18 are held substantially in place by the lower wall 10c of the recess 10a in the face 62 of the second press member 10. In the preferred embodiment of the invention the recess 10a in the face 62 of the second press member 10 is designed as described herein above so as to accommodate the difference in diameters between the second metal prestress layer 18 and the other layers, while keeping the centers of the layers substantially aligned along a common axis 36. In the preferred embodiment of the invention first press member 12 is provided with a recess 12a having a nominally flat, upward facing surface 12b, as shown in FIGS. 3a and 3b. Recess 12a is adapted to receive first metal prestress layer 14. The common axis 36 generally corresponds with the geometric centers of the opposing faces 60 and 62 and the recesses 10a and 12a in the first and second press members 10 and 12, and thus corresponds with the centers of the laminate layers 14, 16, 18, 20, 22, 24 and 26. When the second press member 10 is drawn downward against the actuator stack 32 (step 102) the second press member 10 holds the layers 18, 20, 22, 24 and 26 in fixed position relative to one another.

Next, the second press member 10, which is preferably constructed of a metallic material having a high coefficient of thermal conductivity, is preferably heated 104 by a resistance heating element 38 which is in contact with the second press member 10. Heat is preferably conductively transferred directly from the second press member 10 to the layers (14, 16, 18, 20, 22, 24 and 26) of the actuator stack 32. By conductively transferring heat from the second press member 10 to the stack 32, the stack can be more quickly and efficiently heated than can be accomplished, for example, using convection heating. In addition, because the heat is conductively transferred to the stack 32 from the second press member, it is possible to maintain more precise temperature control of the stack 32 (with a lower source-to-load temperature difference) than can be accomplished, for example, using convection heating.

The energy from resistance heating element 38 causes the temperature of the stack 32 to rise to a temperature above the melting point of the adhesive material in a controlled fashion. The temperature should be controlled such that the temperature of the stack 32 does not exceed the Curie temperature of the ceramic layer 22 (in order to avoid damaging the piezoelectric properties of the ceramic material). The rate at which the temperature of the stack 38 is increased should also be controlled in order to prevent the layers of the stack (principally the ceramic layer 22) from breaking due to non-uniform thermal expansion of the layers. Accordingly, in the preferred embodiment of the invention, means are provided for determining the temperature of the stack 32, and means are provided for regulating the rate of change of temperature of the stack 32. In the preferred embodiment of the invention the means for determining the temperature of the stack comprises a thermocouple sensor 99 which is in contact with the second press member 10. The thermocouple sensor 99 is calibrated such that the temperature sensed (i.e. the temperature of the second press member 10) corresponds to, and is therefore indicative of, the temperature of the stack 32. In the preferred embodiment of the invention the means for regulating the rate of change of temperature of the stack 32 comprises a programmable electronic controller 98 which is in electrical communication with the electrical power source 97.

Bonding of the layers occurs at a high temperature, which depends upon the adhesive used but is typically between 200 and 350 degrees C. Once the melting point of the adhesive material is reached the temperature is held 106 for a predetermined amount of time (e.g. several minutes) to allow the adhesive material to fully spread between adjacent layers. As the adhesive material continues to be heated, it changes from a solid state to a fluid state and some of the adhesive material evaporates and some of the excess adhesive material may be expelled under beyond the sides of the stack 32, allowing for the adhesive material to compress under the continually applied 102 pressure. As the adhesive material melts and evaporates, the first, second and third metal prestress layers 14, 20 and 24, along with the ceramic layer 22 become more closely pressed together by the press members 10 and 12 (as illustrated in FIG. 8) than when pressure is initially applied (as illustrated in FIG. 7).

Figure 8:
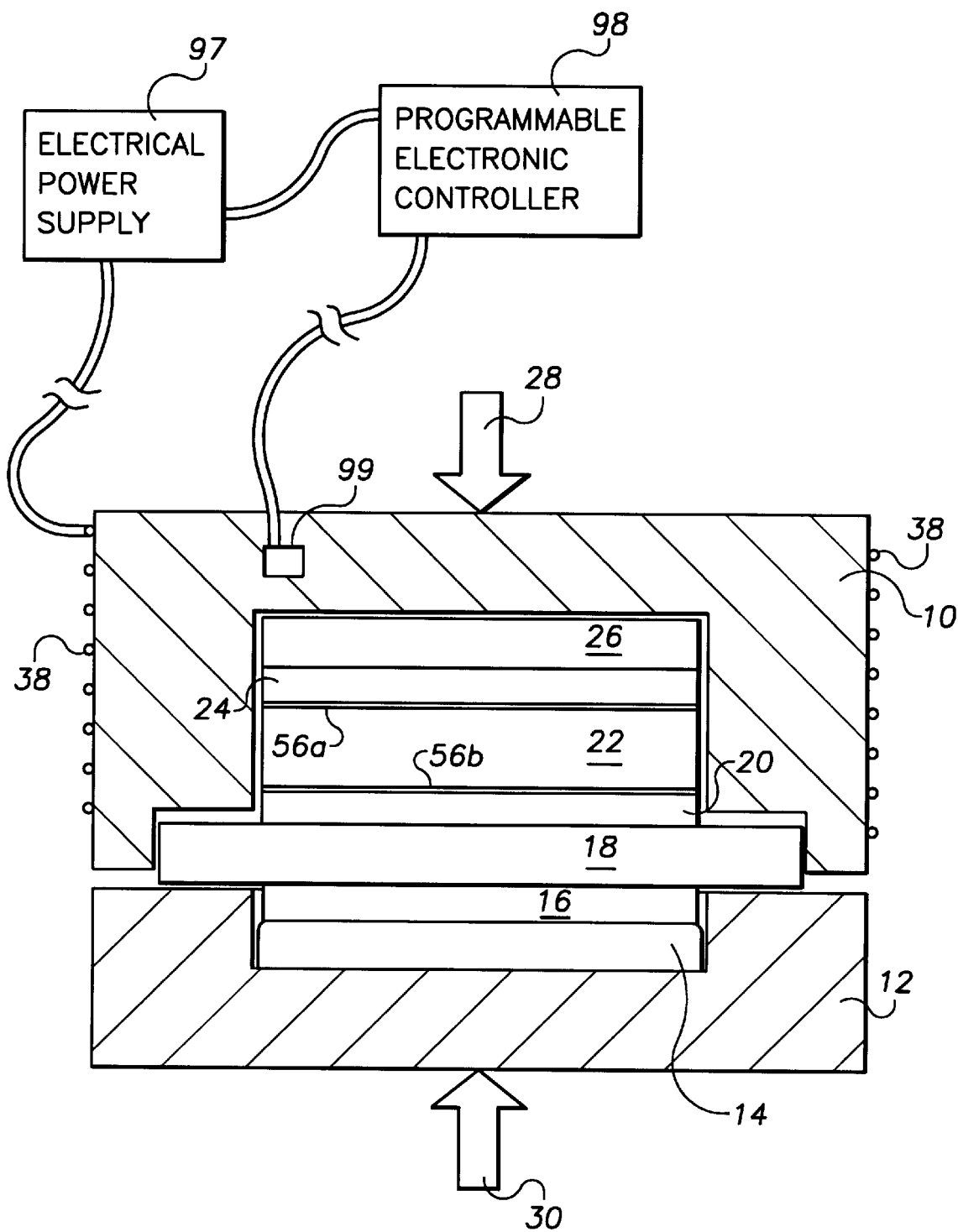
Figure 9:
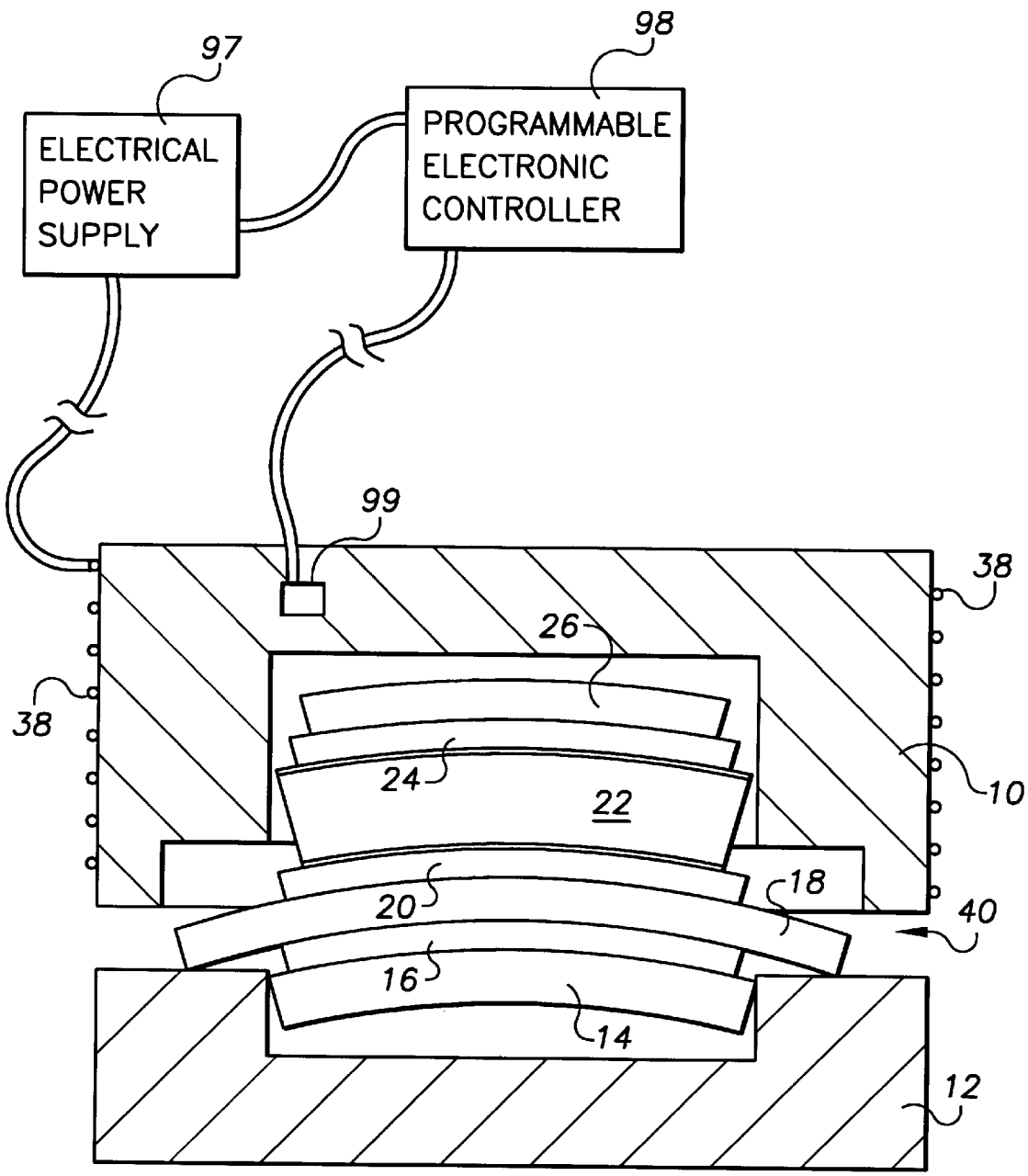

Referring to FIGS. 8 and 9: After the predetermined amount of time for holding the temperature above the melting point of the adhesive material has elapsed, electrical current to the resistance heater 38 from the electrical power supply 97 is decreased and the temperature of the stack 32 is decreased 108 in a controlled fashion, such that, as the actuator stack 32 cools, the first, second and third adhesive layers 16, 20 and 24 re-solidify and integrally bond the first metal prestress layer 14 to the second metal prestress layer 18, and the ceramic layer 22 to the second metal prestress layer 18 and the third metal prestress layer 26. The decreasing of the temperature 108 of the stack 32 in a controlled fashion may be accomplished through the programmable electronic controller 98 in conjunction with the electrical power supply 97.

Once the temperature of the stacked ceramic layer 22, adhesive layers 16, 20 and 24, and metal prestress layers 14, 18 and 26 has dropped sufficiently low to cause adjacent layers of the stack 32 to firmly bond to one another, external pressure applied 102 to the actuator stack 32 by the press members 10 and 12 is reduced or removed 110 and the press members 10 and 12 are drawn apart, as illustrated in FIG. 9. The programmable electronic controller 98, which may be in electrical communication with the means for moving the press members 10 and 12 relative to each other, may also regulate the application 102 and removal 110 of pressure in response to a temperature signal from the thermocouple sensor 99. As the layers of the assembled actuator 40 cool down, asymmetric stress are imposed upon the ceramic layer 22 due to the differences in coefficients of thermal contraction between the ceramic layer 22 and the other layers (14, 16, 18, 20, 24, 26) of the actuator 40. These asymmetric stresses cause the actuator 40 to assume a curved shape, as illustrated in FIG. 9, when the press members 10 and 12 are drawn apart.

Next, the assembled actuator 40 is removed 112 from between the first and second press members 10 and 12. The actuator 40 may be removed from the press members 10 and 12 by vacuum means, robotic means, magnetic means, or by other means (not shown) and allowed to cool 114 to the ambient temperature.

Figure 10:
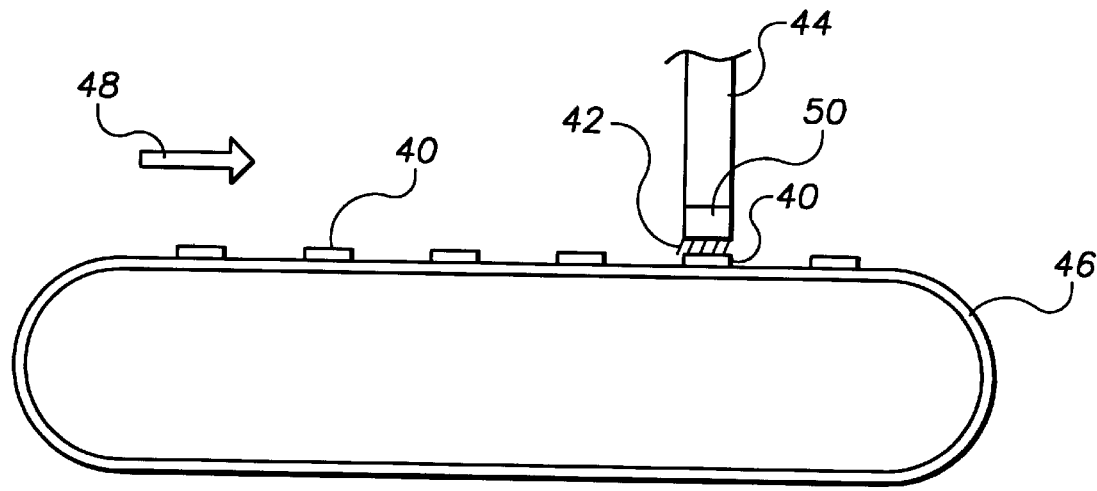
FIG. 10 is a schematic side elevation of an apparatus used in the polarization of piezoelectric actuators in accordance with the present invention.

After the assembled actuator 40 has cooled to ambient temperature, it is electrically polarized 116. In the preferred embodiment of the invention, the assembled actuators 40 are placed on a grounded, metallic, first conveyor belt 46 (as illustrated in FIG. 10) which is moving in the direction indicated by arrow 48. A brush arm 44 with an electrically charged metal brush 42 attached thereto is located adjacent the first conveyor belt 46 such that the metal brush 42 is held in close proximity to the first conveyor belt 46. As each assembled actuator 40 travels down the first conveyor belt 46 the actuator 40 comes into contact with the metal brush 42. At the instant the actuator 40 comes into contact with the metal brush 42, the metal brush 42 is electrically charged by the power supply 50, and the bottom of the assembled actuator 40 is electrically conducted to the (grounded) belt 46; and the brush 42 electrically conducts to the top layer (the third metal prestress layer 26) of the assembled actuator 40. The high voltage charge of the metal brush 42 (e.g. 1200 volts DC) polarizes 116 the ceramic layer 22 of the actuator 40. The power supply 50 is only turned on after the actuator 40 establishes contact with the metal brush 42 to prevent arcing as the actuator 40 comes into close proximity with the metal brush 42. However, in a modification of the present invention the metal brush may be continuously electrically charged.

Figure 15:
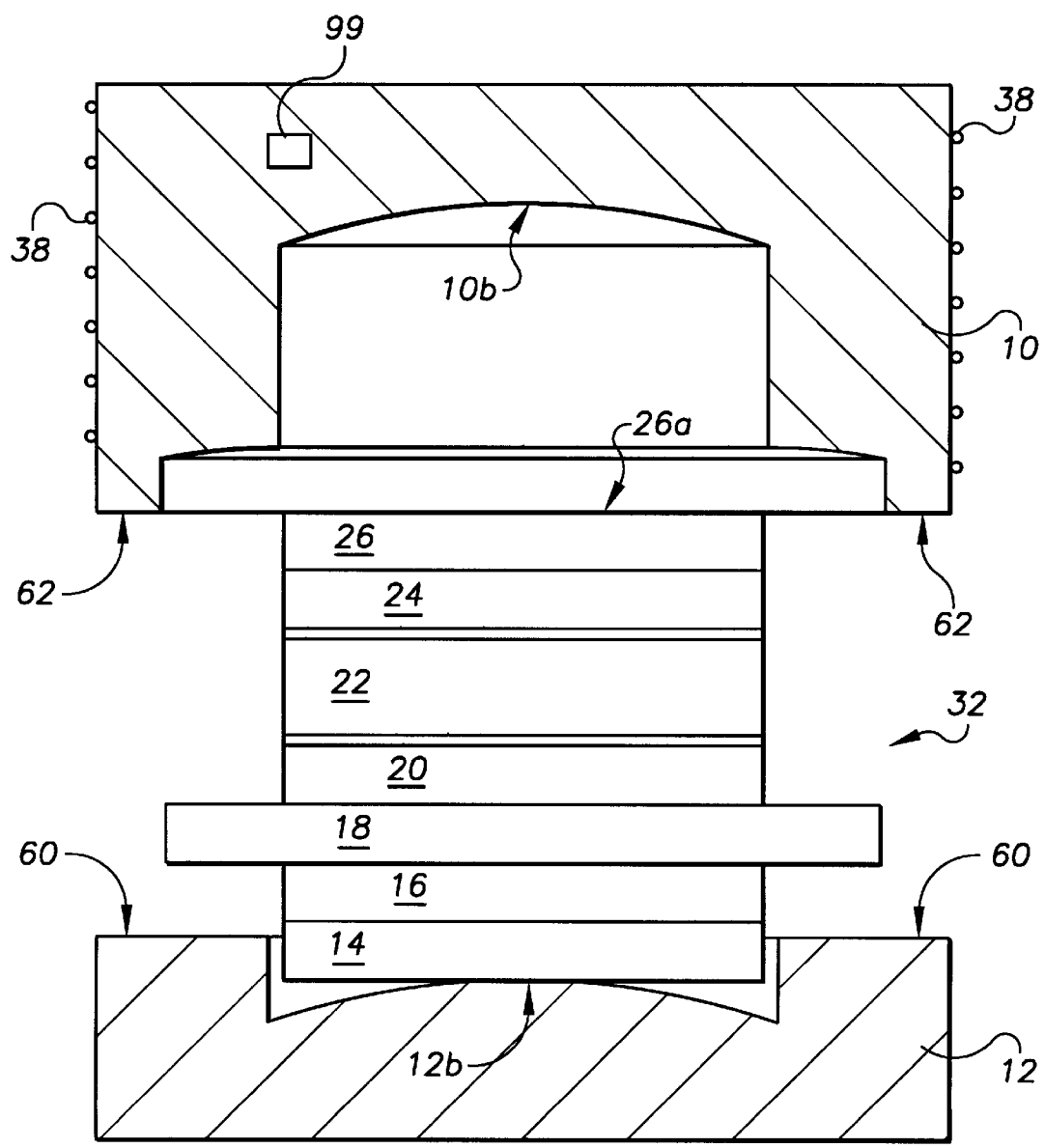

In the preferred embodiment of the invention the downward facing surface 10b of the recess 10a in the face 62 of the second press member 10, and the upward facing surface 12b of the recess 12a in the face 60 of the first press member 12 are each nominally flat, so as to correspond to the nominally flat opposite faces 14a and 26a of the first and third metal prestress layers 14 and 26, respectively. By constructing the downward facing surface 10b of the recess 10a in the second press member 10, and the upward facing surface 12b of the recess 12a in the first press member 12 so as initially to have the same profile (i.e. flat) as the opposite surfaces 14a and 26a of the first and third metal prestress layers 14 and 26, respectively, it is possible for the press members 10 and 12 to uniformly apply pressure to the stack 32. However, in the modification of the invention illustrated in FIG. 15, the downward facing surface 10b of the recess 10a in the second press member 10 is concave, and the upward facing surface 12b of the recess 12a in the first press member 12 is convex so as to cause the stack to assume a curved shape (as viewed in elevation) when the two press members 10 and 12 are drawn together and an external force is applied to the stack 32 by the press members. In certain applications of the present invention, the piezoelectric deformation properties of the finished actuator 40 may be advantageously affected by the press members' 10 and 12 molding the component layers of the stack 32 in this fashion before applying heat 104 to the stack 32.

As described above, and as schematically illustrated in FIG. 2, the preferred process for manufacturing actuators in accordance with the present invention comprises the following sequential steps: Apply adhesive layers 100; stack layers 101; apply pressure 102 to the stack (32); apply and increase heat 104 to the stack (32); hold the temperature 106 of the stack (32); decrease heat 108 to the stack (32); release pressure 110 on the stack (32); remove 112 assembled actuator (40) from the press members (10 and 12); cool 114 the assembled actuator (40) to ambient temperature; and electrically polarize 116 the assembled actuator (40). It is, however, within the scope of the invention to modify the sequence of steps from that of the preferred embodiment. For example, it is within the scope of the present invention to cool 114 the assembled actuator (40) to ambient before removing 112 the actuator (40) from the press members (10 and 12). It is also within the scope of the present invention to pre-heat any or all of the individual component layers (14, 16, 18, 20, 22, 24 and 26) prior to stacking 101 the layers between the press members (10 and 12).

The above disclosure describes an apparatus and process for automatically and reliably manufacturing multi-layer, high deformation piezoelectric sensors and actuators at a high rate in accordance with the preferred embodiment of the invention. However, many modifications of the present invention are also contemplated.

Figure 11:
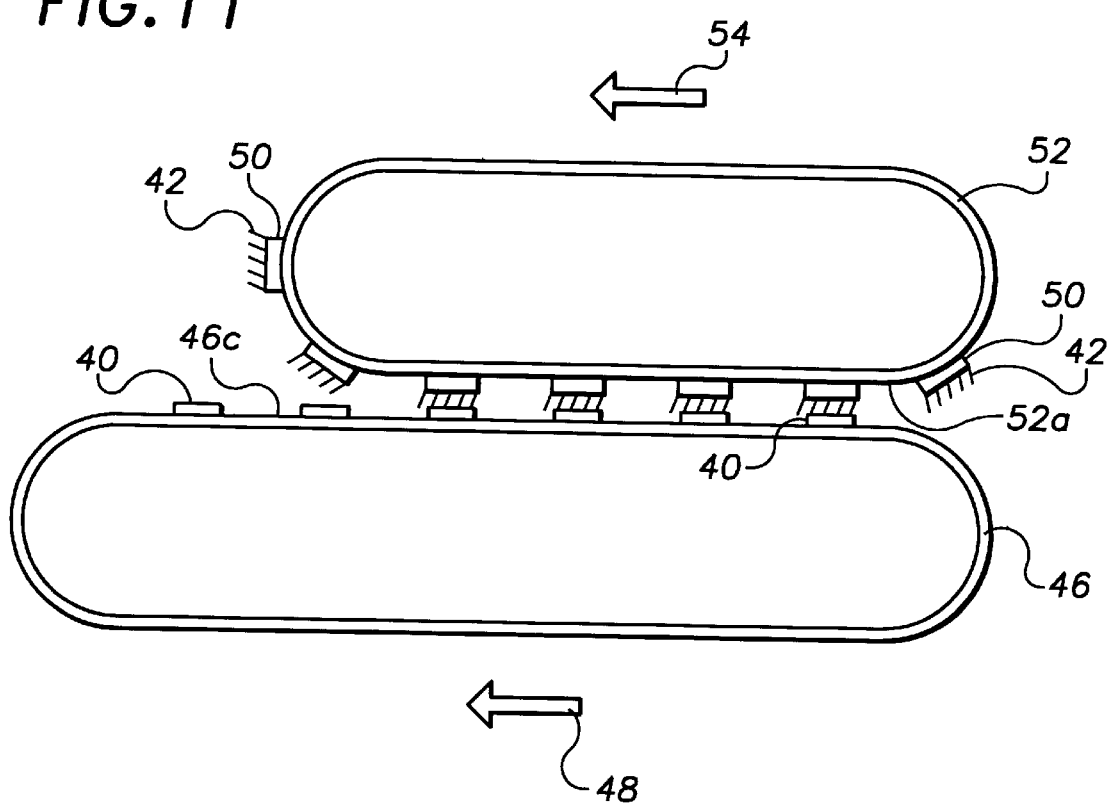
FIG. 11 is a schematic side elevation of a modified apparatus used in the polarization of piezoelectric actuators in accordance with the present invention.

In the modification of the present invention illustrated in FIG. 11, a pair of conveyor belts 46 and 52 are used during the poling of the actuators 40. The first conveyor belt 46 moves in a clockwise 48 direction and the second conveyor belt 52 moves in a counter-clockwise 54 direction, as indicated by arrows 48 and 54, respectively. The actuators 40 are place on the first conveyor belt 46. The second conveyor belt 52 is provided with a plurality of electrically charged metal brushes 42 in fixed spatial relationship to one another. The actuators 40 are advantageously arranged on the first conveyor belt 46 such that each actuator 40 is substantially aligned with a metal brush 42 attached to the second conveyor belt 52 so that as the actuators 40 move across the top section 46a of the first conveyor belt 46 each actuator 40 comes into contact with a metal brush 42 which is moving across the bottom section 52a of the second conveyor belt 52. The metal brush 42 and actuator 40 remain in contact with one another for a predetermined amount of time during which the power supply 50 electrically charges the metal brush 42 which in turn applies a voltage to the actuator 40, thus polarizing it.

As described above, in the preferred embodiment of the invention individual stacks 32 are positioned between the press members 10 and 12 in order to apply pressure 102 and heat 104 to the stack 32 (as illustrated in FIGS. 3b–9).

Figure 12:
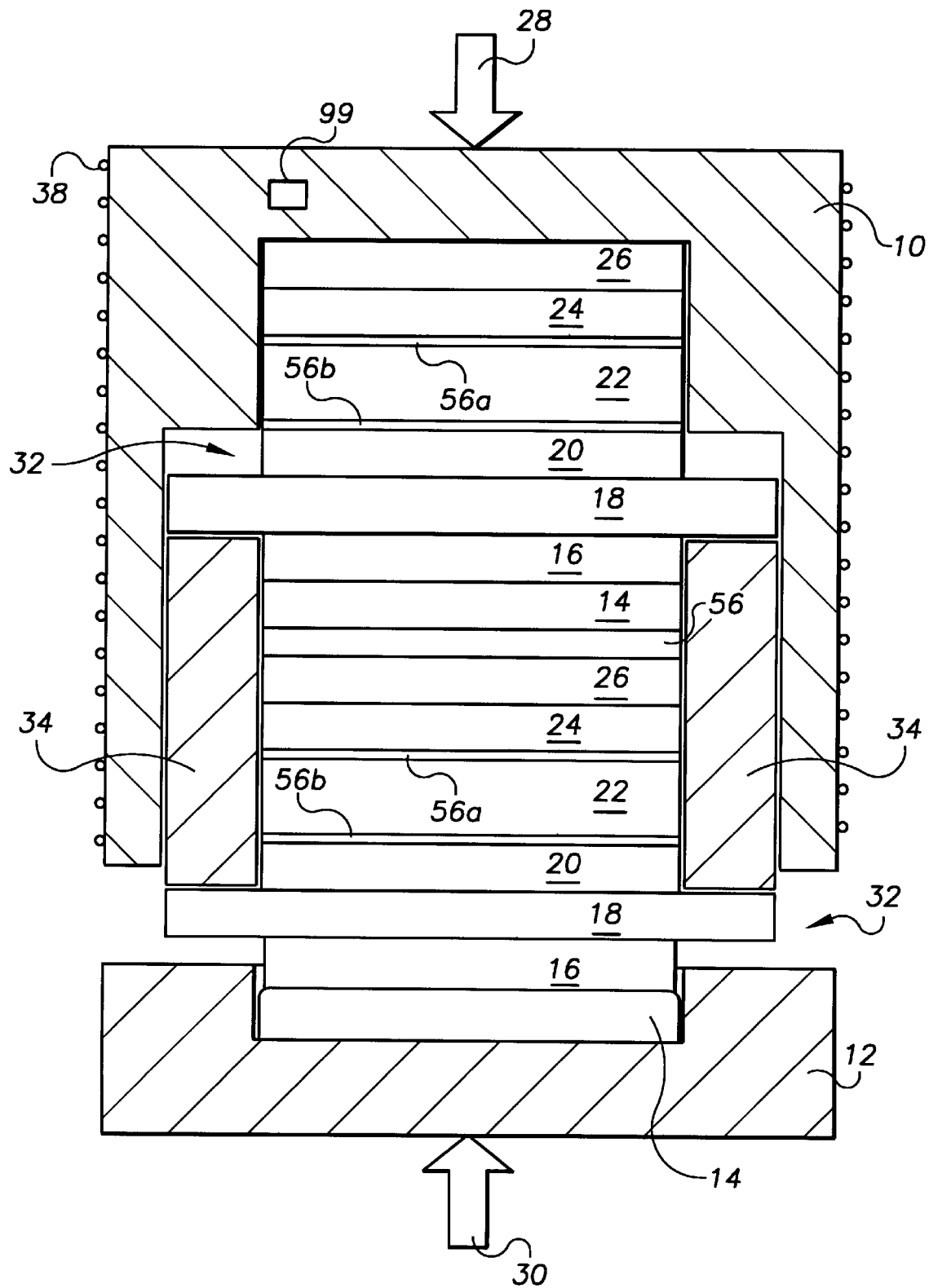
FIG. 12 is a cross-sectional elevation of press members adapted to receive multiple actuator stacks during the manufacture of piezoelectric actuators in accordance with a modification of the present invention.

However, it is within the scope of the present invention to place a plurality of actuator stacks 32 between the first and second press members 10 and 12, (as illustrated in FIG. 12), in order to apply pressure 102 and heat 104 to multiple stacks 32 simultaneously. In this modification of the present invention, seal breaking members 56 (made of TEFLON™ or other non-stick material) may be positioned between the outermost layers of adjacent actuator stacks 32, in order to prevent adjacent actuators from becoming permanently bonded together.

Figure 13:
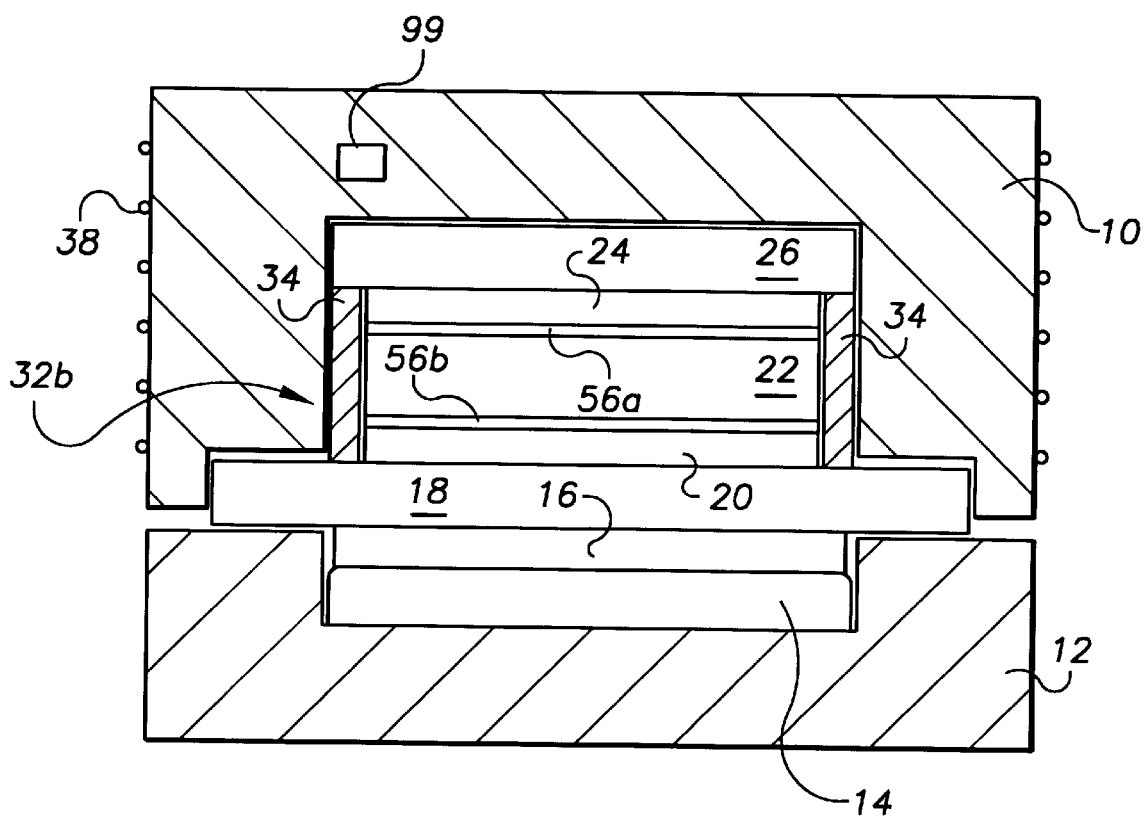
FIG. 13 is a cross-sectional elevation of a modification of the press members and collar members used in the manufacture of piezoelectric actuators in accordance with the present invention.
Figure 14:
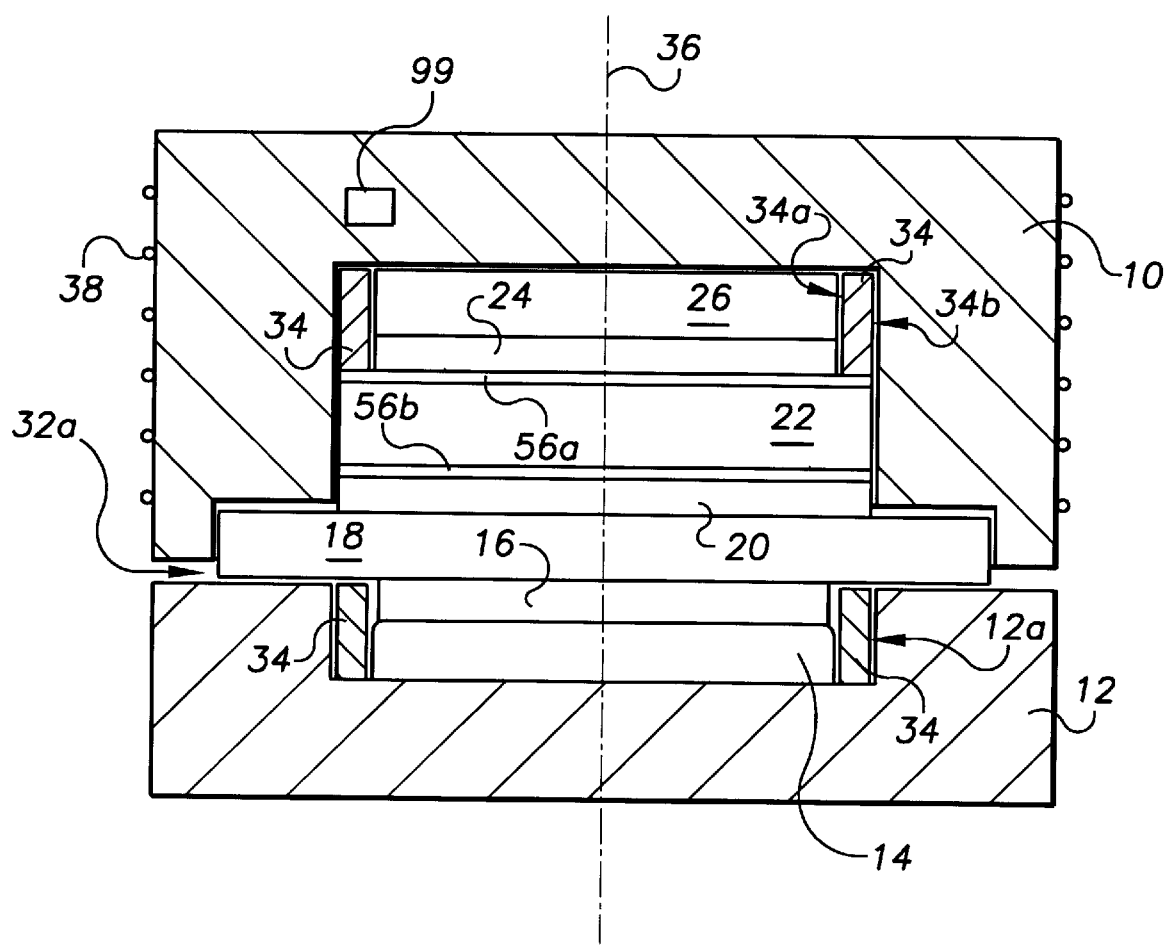
FIG. 14 is a cross-sectional elevation of a modification of the press members and collar members used in the manufacture of piezoelectric actuators in accordance with the present invention; and, FIG. 15 is a cross-sectional elevation of a modification of the press members used in the manufacture of piezoelectric actuators in accordance with the present invention.

As described above, in the preferred embodiment of the invention the individual layers of a stack 32 (namely, adhesive 20, ceramic layer 22, adhesive layer 24, and prestress metal layer 26) are the same size and the same shape. However, it is within the scope of the present invention for the individual component layers (14, 16, 18, 20, 22, 24 and 26) of a stack 32 to be of different shapes and sizes. FIGS. 13 and 14 illustrate modified stacks 32b and 32a, respectively, constructed with layers (14, 16, 18, 20, 22, 24 and 26) of non-uniform diameters. In the modifications illustrated in FIGS. 13 and 14, collar members 34 may be employed, as necessary, to contain any layers (including the ceramic layer, adhesive layers and metal prestress layers) which are of smaller diameter than any of the other layers.

Referring to FIG. 14: A collar member 34 is placed into the recess 12a in the face 60 of the first press member 12 during the stacking step 101 of the process by vacuum means, robotic means or other means commonly used for picking up items. After the collar member 34 is put in position, the first metal prestress layer 14 is placed inside of the collar member 34, such that the side of the first metal prestress layer 14 is adjacent the inner circumference 34a of the collar member 34. The outer circumference 34b of the collar member 34 is adjacent the inner wall 12c of the first press member 12. The collar member holds the subject layers in place such that the centers of all layers 14, 16, 18, 20, 22, 24 and 26 are substantially aligned along a common axis 36 perpendicular to the major faces of the layers 14, 16, 18, 20, 22, 24 and 26 of the modified actuator stack 32a.

While the above description contains many specificities, these should not be construed as limitations on the scope of the invention, but rather as an exemplification of one embodiment and a few modifications thereof. Many other variations are possible, for example:

Adhesives, preferably polyimides, other than LaRC-SI™ which melt below the Curie temperature of the ceramic layer, have strong bonding capabilities, high flexural strength and prestress the ceramic layer upon cooling, may be used to bond adjacent layers of the actuators together;

Any combination of metal prestress layers, adhesive layers and ceramic layers may be used to fabricate an actuator stack including only one metal prestress layer, one adhesive layer and one ceramic layer;

The first, second and third adhesive layers 16, 20 and 24 may be in the form of thin deformable sheets which are placed in their respective locations in the actuator stack 32 separately from the first metal prestress layer 14 and the ceramic layer 22, thus eliminating the application of the adhesive layers step 100 of the process;

The press surfaces 10b and 12b within the recesses 10a and 12a may be convex, concave or flat;

Only the upper 10 or lower press member 12 may have a recess in its face adapted to receive metal prestress layers, adhesive layers and ceramic layers, while the other press member may have no recess in its face;

The press members 10 and 12 and the actuator stack 32 together may be placed in an oven to be heated instead of using a resistance heating element;

The assembled actuator 40 may be allowed to cool while still between the press members 10 and 12;

The centers of the layers of the actuator stack 32 may be unaligned;

Additional metal prestress layers may be added or omitted in order to increase or decrease the stress in the ceramic layer 22 or to affect the strength of the entire actuator 40;

A template which extends beyond the sides of the inner recesses 10a and 12a may be used to hold smaller diameter layers in place (instead of, or in addition to, using a collar member 34;

During the stacking step 101, a ceramic layer or metal prestress layer can be placed on the actuator stack 32 and then the collar member 34 placed around it;

Metal plates may be used to polarize 116 the actuators 40 instead of metal brushes as described above;

One or both of the press members 10 and 12 may be provided with a heating element;

The layers of the actuator may be of various other geometric shapes besides rectangular or circular as described above;

The layers (14, 16, 18, 20, 22, 24, 26, etc.) of the stack 32 may be pre-curved (as viewed in elevation) prior to the stacking step 102;

The temperature sensor 99 may be located on the inside or on the outside of either or both of the press members 10 and 12;

The heating element 38 may be located on the inside or on the outside of either or both of the press members 10 and 12;

The temperature sensor 99 can comprise a sensor other than a thermocouple; and

Other means of heating the press members can be used besides electrical resistance heating.

Accordingly, the scope of the invention should be determined not by the embodiment illustrated, but by the appended claims and their legal equivalents.

We claim:

1. A method of manufacturing a multilayered high deformation piezoelectric actuator, comprising the steps of:

selecting a first piezoelectric ceramic layer, a first metal prestress layer and a second metal prestress layer, said first piezoelectric ceramic layer and said first metal prestress layer and said second metal prestress layer each having two major surfaces, wherein said second metal prestress layer has a dimension that is larger than the other layers;

placing in order in a press said first metal prestress layer, a first adhesive layer, said first piezoelectric ceramic layer, a second adhesive layer and said second metal prestress layer so as to form a stack comprising said first metal prestress layer, said first adhesive layer, said first piezoelectric ceramic layer, said second adhesive layer and said second metal prestress layer;

applying pressure to said stack with said press in a direction perpendicular to each of said major surfaces;

heating said stack to a temperature above a melting point of each of said adhesive layers and below a Curie temperature of said first piezoelectric ceramic layer;

maintaining a temperature of said stack above a melting point of each of said adhesive layers and below a Curie temperature of said first piezoelectric ceramic layer until each of said adhesive layers has melted;

after said step of maintaining the temperature of said stack, decreasing the temperature of said stack to below a melting point of each of said adhesive layers;

after said step of decreasing the temperature of said stack, releasing said pressure;

and, after said step of releasing said pressure, cooling said stack to room temperature;

wherein said step of placing in order in a press said first metal prestress layer, a first adhesive layer, said first piezoelectric ceramic layer, a second adhesive layer and said second metal prestress layer comprises placing a first portion of said stack into a first recess within a first rigid press member and placing a second portion of said stack into a second recess within a said second rigid press member;

and wherein said second recess is configured to accommodate the difference in dimensions between said second metal prestress layer and said other layers.

2. The method according to claim 1, further comprising polarizing said piezoelectric ceramic layer after said step of cooling said stack.

3. The method according to claim 2, wherein said step of applying pressure to said stack comprises moving said first rigid press member toward said second rigid press member.

4. The method according to claim 3, wherein said step of heating said stack comprises raising a temperature of said press first press member or said second press member to above a temperature of said stack and conducting heat from said press to said stack.

5. The method according to claim 4, wherein said first adhesive layer is bonded to said first piezoelectric ceramic layer before said step of placing in order in a press said first metal prestress layer, a first adhesive layer, said first piezoelectric ceramic layer, a second adhesive layer and said second metal prestress layer.

6. The method according to claim 4, wherein said first adhesive layer is bonded to said first prestress layer before said step of placing in order in a press said first metal prestress layer, a first adhesive layer, said first piezoelectric ceramic layer, a second adhesive layer and said second metal prestress layer.

7. The method according to claim 4, further comprising sensing a temperature of said stack concurrently with said step of heating said stack.

8. The method according to claim 4, wherein said step of placing a first portion of said stack into the first recess within a first rigid press member and placing a second portion of said stack into the second recess within said second rigid press member comprises placing said first metal prestress layer into the first recess within said first rigid press member.

* * * * *